United States Patent
Shi et al.

(10) Patent No.: US 9,488,917 B2
(45) Date of Patent: Nov. 8, 2016

(54) MASK AND FABRICATION METHOD THEREOF, AND METHOD OF PATTERNING BY USING MASK

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Dawei Shi, Beijing (CN); Hongliang Liu, Beijing (CN)

(73) Assignees: BOE TECHNOLOGY GROUP CO., LTD., Beijing (CN); BEIJING BOE OPTOELECTRONICS TECHNOLOGY CO., LTD., Bejing (CN)

( * ) Notice: Subject to any disclaimer, the term of this patent is extended or adjusted under 35 U.S.C. 154(b) by 0 days.

(21) Appl. No.: 14/769,713

(22) PCT Filed: Mar. 16, 2015

(86) PCT No.: PCT/CN2015/074301
§ 371 (c)(1),
(2) Date: Aug. 21, 2015

(87) PCT Pub. No.: WO2016/065799
PCT Pub. Date: May 6, 2016

(65) Prior Publication Data
US 2016/0252817 A1  Sep. 1, 2016

(30) Foreign Application Priority Data
Oct. 28, 2014 (CN) .......................... 2014 1 0589976

(51) Int. Cl.
*G03F 1/50* (2012.01)
*G03F 7/20* (2006.01)
*G02F 1/1343* (2006.01)

(52) U.S. Cl.
CPC ............. *G03F 7/20* (2013.01); *G02F 1/13439* (2013.01); *G03F 1/50* (2013.01)

(58) Field of Classification Search
CPC ............. G03F 1/50; G03F 1/54; G03F 7/20; G03F 7/2002; G02F 1/13; G02F 1/13439
USPC ......................................... 430/5, 396; 349/4
See application file for complete search history.

(56) References Cited

U.S. PATENT DOCUMENTS

| 4,653,860 A * | 3/1987 | Hendrix ............ G02F 1/134336 349/110 |
| 2003/0228541 A1* | 12/2003 | Hsu .......................... G03F 1/26 430/296 |
| 2004/0197672 A1* | 10/2004 | Weed .................. G03F 7/70091 430/5 |

FOREIGN PATENT DOCUMENTS

| CN | 101770091 A | 7/2010 |
| CN | 202421717 A | 9/2012 |

(Continued)

OTHER PUBLICATIONS

International Search Report & Written Opinion Appln. No. PCT/CN2015/074301; Dated Jun. 29, 2015.

(Continued)

*Primary Examiner* — John A McPherson
(74) *Attorney, Agent, or Firm* — Ladas & Parry LLP

(57) ABSTRACT

Embodiments of the present disclosure provide a mask and a fabrication method thereof, and a method of patterning by using a mask. The mask comprises: a first substrate and a second substrate disposed oppositely; a liquid crystal layer located between the first substrate and the second substrate; a transparent conductive layer formed on the first substrate, the transparent conductive layer and the liquid crystal layer being located on a same side of the first substrate; and a mask pattern made of a non-transparent conductive material formed on the second substrate, wherein the mask pattern and the transparent electrode are configured to be capable of generating an electric field therebetween, so as to drive liquid crystal molecules in the liquid crystal layer to deflect.

20 Claims, 1 Drawing Sheet

(56) References Cited

FOREIGN PATENT DOCUMENTS

| | | |
|---|---|---|
| CN | 104280997 A | 1/2015 |
| JP | 63210844 A | 9/1988 |
| JP | 6474535 A | 3/1989 |
| KR | 20020089811 A | 11/2002 |
| KR | 20030057601 A | 7/2003 |
| KR | 20090106905 A | 10/2009 |

OTHER PUBLICATIONS

Korean Office Action dated Jun. 10, 2016; Appln. No. 10-2015-7023445.

* cited by examiner

MASK AND FABRICATION METHOD THEREOF, AND METHOD OF PATTERNING BY USING MASK

TECHNICAL FIELD

Embodiments of the present disclosure relate to a mask and a fabrication method thereof, and a method of patterning by using a mask.

BACKGROUND

A mask pattern of a conventional mask has different line density in respective regions, for example, line density of the mask pattern corresponding to scanning line in a fanout wiring region (which is consistent with a wiring density of a fanout wiring region) is usually relatively large (in other words, light transmissive gaps in the mask pattern is relatively small), while line density of the mask pattern corresponding to a pixel region is relatively small (in other words, the light transmissive gap in the mask pattern is relatively large). During the exposure, although exposure doses received by different regions of the mask are the same, yet the difference in the line density will cause difference in light transmittance in different regions (for example, in a region where the patterns are denser, the light transmittance is relatively low), so that the exposure dose required by the region with a larger line density is greater, and thus, it is difficult to ensure sizes after ideal exposure and development in different regions at the same time, which is not conducive to simplification of mask process.

SUMMARY

An embodiment of the present disclosure provides a mask, comprising: a first substrate and a second substrate disposed oppositely; a liquid crystal layer located between the first substrate and the second substrate; a transparent conductive layer formed on the first substrate, the transparent conductive layer and the liquid crystal layer being located on a same side of the first substrate; and a mask pattern made of a non-transparent conductive material formed on the second substrate, wherein the mask pattern and the transparent electrode are configured to be capable of generating an electric field therebetween, so as to drive liquid crystal molecules in the liquid crystal layer to deflect.

An embodiment of the present disclosure further provides a fabrication method of a mask, comprising: forming a transparent conductive layer on a first substrate; forming a mask pattern on a second substrate, a forming material for the mask pattern including a non-transparent conductive material; cell-assembling the first substrate and the second substrate, and forming a liquid crystal layer between the first substrate and the second substrate, the transparent conductive layer and the liquid crystal layer being located on a same side of the first substrate; forming electrical connection between a voltage supply unit and the transparent conductive layer and electrical connection between the voltage supply unit and the mask pattern, the voltage supply unit being configured to provide preset voltage for the mask pattern and the transparent conductive layer, to generate an electric field for driving liquid crystal molecules in the liquid crystal layer to deflect.

An embodiment of the present disclosure further provides a patterning method by using a mask, wherein, the mask is the above described mask, the method comprising: providing preset voltage for the mask pattern and the transparent conductive layer by the voltage supply unit, to generate an electric field therebetween, so as to drive liquid crystal molecules in the liquid crystal layer to deflect; irradiating the first substrate, so that part of light passes through the first substrate, the transparent conductive layer, the liquid crystal layer and the second substrate sequentially, and exits from a region of the second substrate without the mask pattern thereon.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the disclosure.

DETAILED DESCRIPTION

Figure 1:
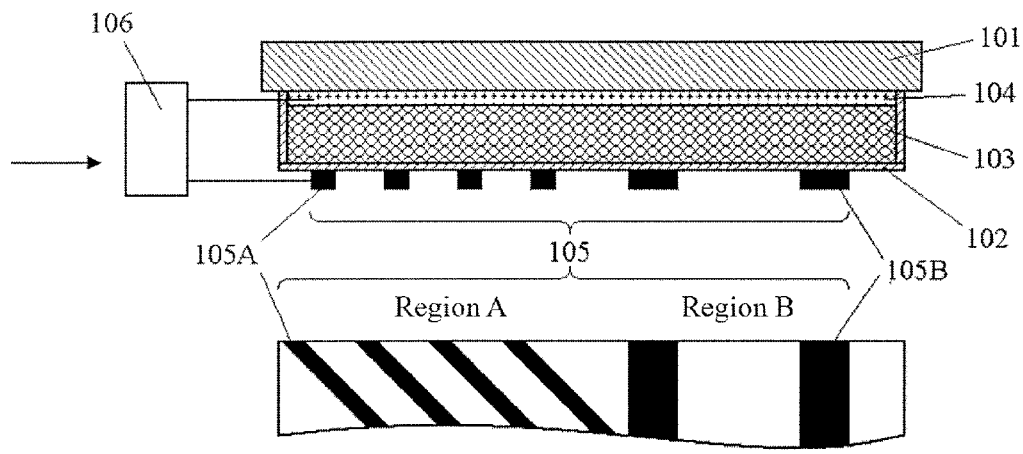
FIG. 1 is a structural schematic diagram of a mask according to an embodiment of the present disclosure.

In order to make objects, technical solutions and advantages of the embodiments of the present disclosure more apparent, the technical solutions of the embodiment will be described in a clearly and fully understandable way in connection with the drawings related to the embodiments of the present disclosure. It is obvious that the described embodiments are just a portion but not all of the embodiments of the present disclosure. Based on the described embodiments herein, those skilled in the art can obtain all other embodiment(s), without any inventive work, which should be within the scope of the present disclosure.

It should be noted that in the description of the present disclosure, directional or positional relationships shown by terms such as "upper", "lower" are directional or positional relationships shown as in the drawings, which only means to facilitate description of the disclosure and simplify the description, but do not indicate or imply that the devices or components must have specific directions, or be constructed or operated in the specific directions, and are not limitative of the present disclosure. Unless expressly stipulated or defined, terms "mounted", "connected" and "linked" should be broadly understood, for example, they may be fixedly connected, detachably connected, or integrally connected; may be mechanically connected or electrically connected; or may be directly connected, indirectly connected by a medium, or internally communicated between two components. Those skilled in the art can understand the specific meanings of the above-mentioned terms in the embodiments of the present disclosure according to the specific circumstances.

The embodiments of the present disclosure provide a mask and a fabrication method thereof, and a method of patterning by using a mask, so as to solve problems of excessively large difference in exposure doses of regions with different line densities, and difficulty in controlling size after exposure and development.

FIG. 1 shows a structure of a mask according to an embodiment of the present disclosure, wherein an upper portion of FIG. 1 shows a cross-sectional structure of the mask, and a lower portion of FIG. 1 shows a portion of a bottom view of the mask. As shown in FIG. 1, the mask comprises:

A first substrate 101 and a second substrate 102 disposed oppositely;

A liquid crystal layer 103 located between the first substrate 101 and the second substrate 102;

A transparent conductive layer 104 formed on the first substrate 101, the transparent conductive layer 104 and the above-described liquid crystal layer 103 being located on a same side of the first substrate 101; and A mask pattern 105 made of a non-transparent conductive material and formed on the above-described second substrate 102. The mask pattern 105 and the transparent conductive layer 104 are configured to be capable of generating an electric field therebetween, so as to drive liquid crystal molecules in the liquid crystal layer 103 to deflect.

As shown in the lower portion of FIG. 1, the mask pattern 105, shown by a black striped pattern, includes a first sub-mask pattern 105A in a region A and a second sub-mask pattern 105B in a region B. In FIG. 1, the first sub-mask pattern 105A includes a plurality of first mask pattern portions separated from one another, for example, a plurality of tilted mask stripes arranged in parallel and at equal intervals; the second sub-mask pattern 105B also includes a plurality of second mask pattern portions separated from one another, for example, a plurality of straight mask stripes arranged in parallel and at equal intervals (only two stripes are shown in FIG. 1). A first interval between two adjacent tilted mask stripes in the region A is less than a second interval between two adjacent straight mask stripes in the region B.

In this embodiment, the mask optionally comprises a voltage supply unit 106 connected with the above-described transparent conductive layer 104 and the above-described mask pattern 105, and used for providing a preset voltage for the mask pattern 105 and the transparent conductive layer 104, to generate the electric field therebetween.

As for the liquid crystal layer 103 in the mask, in a transverse direction parallel to the second substrate (such as a direction indicated by the arrow in FIG. 1 and FIG. 2), in its portion closer to the mask pattern, corresponding liquid crystal deflection is relatively more orderly due to a stronger electric field, and thus light transmittance of the corresponding liquid crystal is larger; while in its portion away from the mask pattern, corresponding liquid crystal deflection is relatively more disordered due to a weaker electric field, and thus light transmittance of the corresponding liquid crystal is smaller. And as for the structure of the mask except for the liquid crystal layer 103, the light transmittance of the portion closer to the mask pattern is smaller, while the light transmittance of the portion away from the mask pattern is larger. These two effect cancel each other out, so that light transmittance in each light transmissive gap tends to be uniform, and further, light transmittance in the light transmissive gaps of different sizes also tends to be consistent. That is to say, the embodiment of the present disclosure allows rays with the same intensity, after passing through the regions of the mask with different line densities, to have consistent light intensity, and thus, can solve the problems of excessively large difference in exposure doses of regions with different line densities and difficulty in controlling size after exposure and development.

It should be explained that, the shape and region division of the mask pattern 105 on the second substrate 102 are shown in the drawings only taking the first sub-mask pattern 105A including a plurality of mask pattern portions of tilted stripes in the region A, and the second sub-mask pattern 105B including a plurality of mask pattern portions of straight stripes in the region B on the second substrate 102 as an example.

The above-described mask pattern 105 can include a plurality of strip electrodes spaced from one another (e.g., a black striped region in FIG. 1). In FIG. 1, the above-described mask pattern 105 is formed on the second substrate in different regions (e.g., the region A and the region B shown in FIG. 1). In each region, all the strip electrodes have a same width, and the intervals between each two adjacent strip electrodes are equal (i.e., the regions of the mask pattern are divided according to width and interval of the strip electrodes). The above-described strip electrodes can block passage of light to form the wiring patterns, for example, in a fanout wiring region or a pixel region in the array substrate. Of course, the mask pattern 105 can be a pattern of other shapes (e.g., one or more of patterns including a round dot, a rectangular block, a strip and an arc), and its regions may also be divided in other ways, which will not be limited by the embodiment of the present disclosure. Furthermore, in FIG. 1, the mask pattern 105 is located at a outer side the second substrate 102 (on a side different from the liquid crystal layer 103), and the mask pattern 105 can also be located at an inner side the second substrate 102 (on the same side as the liquid crystal layer 103), which will not be limited by the embodiment of the present disclosure.

In this embodiment, the first substrate 101 and the second substrate 102 are disposed oppositely, and the liquid crystal in the liquid crystal layer 103 is sealed between the two substrates; and the voltage supply unit 106 provides voltage for the transparent conductive layer 104 and the mask pattern 105, so that the liquid crystal in the liquid crystal layer 103 can deflect under action of the electric field between the two substrates. That is to say, the above-described mask according to this embodiment can be regarded as a liquid crystal cell, in which the transparent conductive layer 104 can be regarded as a common electrode or an upper electrode, the mask pattern 105 can be regarded as a pixel electrode or a lower electrode, and main factors affecting deflection of the liquid crystal in the liquid crystal layer 103 is the shape of the mask pattern 105 and the level of voltage applied to the mask pattern 105.

Materials for forming the first substrate 101 and the second substrate 102 have transparent and non-conductive properties, in particular, can include glass, quartz or the like, plastic, rubber, a glass fiber, a transparent resin or other polymeric materials.

A material for forming the transparent conductive layer 104 has transparent and conductive properties, in particular, can include Indium Tin Oxide (ITO), Indium Zinc Oxide (IZO), a transparent conductive resin or other transparent conductive materials.

A material for forming the mask pattern 105 has non-transparent and conductive properties, in particular, can include, for example, iron, copper, aluminum, nickel, molybdenum, chromium, or other metals, or metal oxides or nitrides, alloys, a multilayer film including a metal layer, a non-transparent conductive resin material (e.g., a resin material added with carbon black) and so on. In an example, the material for forming the mask pattern 105 includes metallic chromium, which can meet requirements on the mask pattern 105 in various aspects including opacity, electrical conductivity, and stability, etc.

The voltage supply unit 106 for providing a preset voltage for the mask pattern 105 and the transparent conductive layer 104 can generally include a voltage source and a resistor or other electrical elements for changing an output voltage. An output electrodes of the voltage supply unit 106 can be connected with an electrode lead-out position of the transparent conductive layer 104 on a surface or a side, and another output electrode of the voltage supply unit 106 can be connected with an electrode lead-out position of the mask pattern 105 through a transparent conductive medium. Of course, the voltage supply unit 106 of other structure or other electrical connection modes can be used, for example, the transparent conductive layer 104 and the mask pattern 105 can be connected with different voltage supply units, respectively, which will not be limited by the embodiment of the present disclosure.

Figure 2:
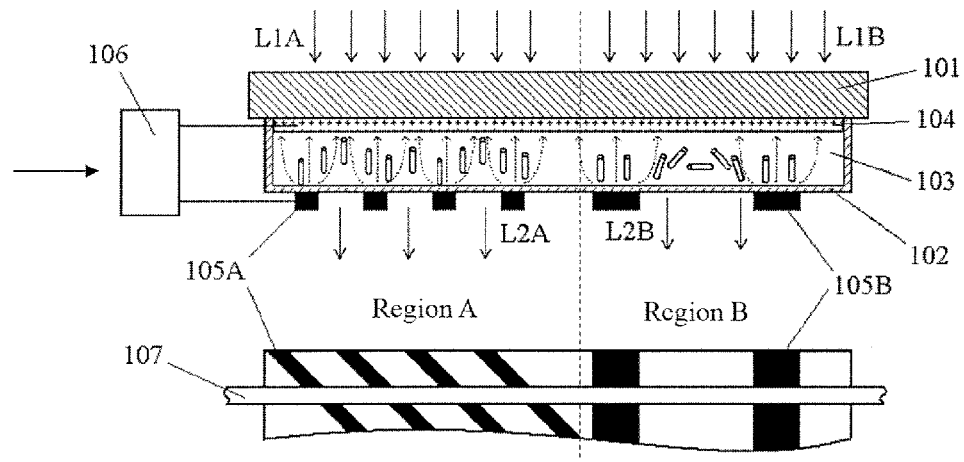
FIG. 2 is a schematic diagram of working principle of a mask according to an embodiment of the present disclosure.

A working principle of the mask of the above-described structure provided by the embodiment of the present disclosure is as follows:

With reference to a schematic diagram of working principle of the mask as shown in FIG. 2, the mask shown in FIG. 2 and the mask shown in FIG. 1 are consistent in structure. After the first sub-mask pattern 105A, the second sub-mask pattern 105B and the transparent electrode layer 104 is provided with the preset voltages by the voltage supply unit 106 to generate the electric field, the liquid crystal in the liquid crystal layer 103 deflects a certain angle under the action of the electric field. As for the liquid crystal layer 103 above the second substrate 102, the liquid crystal in the regions corresponding to the sub-mask patterns 105A and 105B (e.g., the regions right above the sub-mask patterns 105A and 105B) and the nearby region deflects orderly, and thus, the transmittance of the liquid crystal layer 103 in these regions is higher; while in the regions farther away from the sub-mask patterns 105A and 105B, deflection of the liquid crystal in the liquid crystal layer 103 is relatively disordered, and thus, the transmittance of the liquid crystal layer 103 in these regions is lower. Therefore, when rays L1A and L1B with the same intensity irradiate the regions corresponding to the region A and the region B on the first substrate 101 respectively, due to a smaller light transmissive gap of the first mask pattern 105A (a higher line density), the deflection of the liquid crystal of the liquid crystal layer 103 in the region A is more orderly on the whole, and thus, the transmittance of the liquid crystal layer 103 in the region A is larger; while in the region B, the line density of the second mask pattern 105B is lower, and the deflection of the liquid crystal in the liquid crystal layer 103 is relatively disordered in some regions, and thus, the transmittance of the liquid crystal layer 103 in the region B is smaller. Due to existence of the above-described effects, in the region with a low line density which originally has a larger transmittance, the light transmittance is reduced relatively, while in the region with a high line density which originally has a smaller transmittance, the light transmittance is increased relatively (that is, self-compensation of the regions with different line densities for the transmittance), so that the rays L2A exit from the region A and the rays L2B exit from the region B tend to be consistent in overall light intensity, which can thus solve the problems of excessively large difference in exposure doses of regions with different line densities, and difficulty in controlling the size after exposure and development.

In the above-described embodiments, if there are mask pattern portions separated from one another due to pattern discontinuity or other factors (e.g., the strip electrodes separated from one another in FIG. 1), these separated mask pattern portions can each have the preset voltage by respectively connecting with the output electrode of the voltage supply unit 106. In this case, the voltage supply unit 106 can provide the preset voltage of the same level for each mask pattern portion. In an example, each mask pattern portion is connected with one electrode of the voltage source; or, the preset voltage of different levels can also be provided for each mask pattern portion. For example, each mask pattern portion is connected with one electrode of one voltage source in the voltage supply unit 106. With respect to setting of the level of the voltage, it is easier to provide the same voltage for all the mask pattern portions, or to respectively provide different voltages for mask pattern portions in different regions, or more particular, to respectively adjust the voltage provided for each mask pattern portion so as to achieve a better transmittance regulatory effect.

However, if a mode of direct connection with the electrode(s) of the voltage source is adopted, a lot of redundant wiring will be introduced, which is disadvantageous to improve space and the material utilization. In this regard, a connection pattern 107 shown in FIG. 2 can be used to electrically connect the mask pattern portions separated from one another. In order not to change an actual light-shielding region of the mask pattern, the transparent conductive material can be selected to form the above-described connection pattern 107. In an example, the connection pattern 107 can be disposed below the mask pattern 105, that is, the connection pattern 107 is formed firstly, and then the mask pattern 105 is formed; in another example, the connection pattern 107 can also be disposed above the mask pattern 105, that is, the mask pattern 105 is formed firstly, and then the connection pattern 107 is formed, so that the mask pattern 105 is located on a plane parallel to the transparent conductive layer 104, and an uniformity intensity of the electric field formed by the mask pattern 105 is assured.

In an implementation mode, the above-described connection pattern is further used for electrically connecting any two of the mask pattern portions separated from each other on the second substrate 102; the voltage supply unit 106 is connected with the mask pattern 105 through the above-described connection pattern; the voltage supply unit 106 includes a voltage source for providing a preset voltage between the mask pattern 105 and the transparent conductive layer 104. That is, all the mask pattern portions 105 separated from one another are electrically connected through the connection pattern, so that the whole mask pattern forms an integral electrode, with the same voltage in everywhere. In addition, the electrode lead-out position of the above-described mask pattern 105 is also included in the connection pattern, so that there is no need to provide any metal wire connected with the voltage supply unit 106 in the light-transmissive region.

In another implementation mode, the mask pattern 105 is formed on the second substrate 102 in different regions, the above-described connection pattern is further used for electrically connecting any two of the mask pattern portion separated from each other on the second substrate 102; the voltage supply unit 106 is respectively connected with the mask pattern portions in at least one region, and includes at least one voltage source, and the above-described at least one voltage source is used for respectively providing the preset voltage for the mask pattern portions and the transparent conductive layer 104 in the at least one region. That is, the mask pattern portions in each region forms a regional electrode, and the voltage supply unit 106 provides the preset voltage for respective regional electrodes. And, the connection pattern includes the electrode lead-out position of each regional electrode. In addition to the above-described advantages, this design allows the voltage on each regional electrode to be controlled separately; the preset voltage is set to be the same in everywhere; and this design, due to absence of voltage drop caused by material resistance, can further improve uniformity of the voltage, and is applicable to the design of the mask of a large size.

Optionally, the above-described connection pattern, for example, includes a strip connection pattern that is not parallel to any strip mask pattern portion, just as shown by the connection pattern 107 in FIG. 2; since the strip connection pattern is not parallel to any strip mask pattern portion, it intersects with these strip mask patterns more easily, and plays a role in forming electrical connection among the mask pattern portions separated from one another, which is especially applicable to the design of the mask with striped mask pattern. Moreover, the strip connection pattern is not only easily implemented in fabrication process, but also is applicable to the mask patterns of different shapes, and thus is applied more broadly. Further, the connection pattern 107, for example, can be formed in a non-transmissive region of the mask.

In any of the above-described embodiments, it is not limitative whether the mask pattern 105 and the liquid crystal layer 103 are located on at the same side or on different sides of the second substrate 102, since the mask pattern 105 on either side can control the liquid crystal in the liquid crystal layer 103 to deflect. In a case where the mask pattern 105 and the liquid crystal layer 103 are located on two sides of the second substrate 102, the liquid crystal layer 103 maintains the same thickness everywhere, which facilitates other subsequent operation to be performed on the mask pattern 105.

In any of the above-described embodiments, the liquid crystal in the liquid crystal layer 103 may be made to have a preset pretilt angle, which, for example, can be implemented by a liquid crystal alignment technology in a liquid crystal box-forming process, in order to further improve optical properties of the liquid crystal layer 103, and to improve accuracy of transmittance adjustment.

Based on the structure of the above-described mask, an embodiment of a fabrication method of the mask is exemplified hereinafter. The embodiment of the present disclosure provides a fabrication method of a mask, comprising:

Step 301: forming a transparent conductive layer on a first substrate;

Step 302: forming a mask pattern including at least two mask pattern portions separated from one another on a second substrate, the mask pattern being made of a material including a non-transparent conductive material;

Step 303: cell-assembling the first substrate and the second substrate, and forming a liquid crystal layer between the first substrate and the second substrate, the transparent conductive layer and the liquid crystal layer being located on a same side of the first substrate;

Step 304: forming electrical connection between a voltage supply unit and the transparent conductive layer, and forming electrical connection between the voltage supply unit and the mask pattern, the voltage supply unit configured for providing a preset voltage between the mask pattern and the transparent conductive layer.

For example, before the step 302 and after the step 303, the method further comprises a step 302a: forming a connection pattern on the second substrate so as to electrically connect the at least two mask pattern portions separated from one another, a material for forming the connection pattern including a transparent conductive material.

Hereinafter, an example of a fabrication method of a mask is provided: a transparent conductive material such as indium tin oxide (ITO) is evaporated onto a quartz substrate (the first substrate) with a thickness of about 10 mm, so as to form a transparent conductive layer. A polyimide (Pl) solution is coated on an upper surface of another glass substrate (the second substrate) and the above-described transparent conductive layer, and after rubbing alignment, cell-assembling and other processes, the liquid crystal is sealed between the two substrates with a certain pretilt angle, and the transparent conductive layer is made available for connecting with an external voltage. A non-transparent conductive metal such as chromium is evaporated onto a lower surface of the glass substrate, then photoresist is coated, and the above-described mask pattern is formed by mask process, then a layer of material with high transmittance and good electrical conductivity is further evaporated, and after the mask processes such as adhesive coating, laser irradiation, etching and stripping, the above-described connection pattern is formed to connect the portions separated from one another in the above-described mask pattern. Since the connection pattern is transparent, the transmittance is not affected, and no additional pattern will be left on the substrate. Finally, a voltage supply unit is set to provide external voltage to common electrode and the mask pattern.

Since the fabrication method of the mask provided by the embodiment of the present disclosure and the above-described mask have corresponding technical features, the method can also solve the same technical problem, and produce the same technical effect.

Based on the structure of the above-described mask, an embodiment of a patterning method by using the mask is exemplified hereinafter. The embodiment of the present disclosure further provides a patterning method by using the mask, comprising:

Step 401: providing preset voltage for the mask pattern and the transparent conductive layer by the voltage supply unit, to generate an electric field therebetween;

Step 402: irradiating the first substrate, so that part of light passes through the first substrate, the transparent conductive layer, the liquid crystal layer and the second substrate sequentially, and exits from a region of the second substrate without the mask pattern.

Therein, a main process of patterning by using a mask includes operations such as photolithography by using light passing through the mask. The patterning method according to the embodiment of the present disclosure is special mainly in the setting of the preset voltage (which has been described above) and more uniform light transmittance of the above-described mask. Since the patterning method by using the mask provided by the embodiment of the present disclosure and the above-described mask have corresponding technical features, the method can also solve the same technical problems, and produce the same technical effect.

According to the above description, at least the following structures and the methods can be provided by the embodiments of the present disclosure:

(1) A mask, comprising:

a first substrate and a second substrate disposed oppositely;

a liquid crystal layer located between the first substrate and the second substrate;

a transparent conductive layer formed on the first substrate, the transparent conductive layer and the liquid crystal layer being located on a same side of the first substrate; and a mask pattern made of a non-transparent conductive material formed on the second substrate, wherein the mask pattern and the transparent electrode are configured to be capable of generating an electric field therebetween, so as to drive liquid crystal molecules in the liquid crystal layer to deflect.

(2) The mask according to (1), wherein the mask pattern includes a first sub-mask pattern located in a first region and a second sub-mask pattern located in a second region different from the first region, the first sub-mask pattern including at least two first mask pattern portions separated at a first interval, the second sub-mask pattern including at least two second mask pattern portions separated at a second interval, and the first interval being smaller than the second interval.

(3) The mask according to (1) or (2), further comprising a voltage supply unit connected with the transparent conductive layer and the mask pattern, and configured to provide preset voltage for the mask pattern and the transparent conductive layer, to generate the electric field.

(4) The mask according to (2) or (3), wherein, all of the first mask pattern portions and all of the second mask pattern portions are electrically connected with one another.

(5) The mask according to (4), wherein, the second substrate further includes a connection pattern made of a transparent conductive material formed thereon, and all of the first mask pattern portions and all of the second mask pattern portions are electrically connected with one another through the connection pattern.

(6) The mask according to (2) or (3), wherein, all of the first mask pattern portions are electrically connected with one another, all of the second mask pattern portions are electrically connected with one another, and any of the first mask pattern portions and any of the second mask pattern portions are electrically isolated.

(7) The mask according to any one of (1) to (6), wherein, the first mask pattern portion includes a strip electrode, the second mask pattern portion includes a strip electrode.

(8) The mask according to any one of (1) to (7), wherein, the mask pattern and the liquid crystal layer are located on two sides of the second substrate, respectively.

(9) The mask according to any one of (1) to (8), wherein, the liquid crystal molecules in the liquid crystal layer have preset pretilt angle.

(10) The mask according to any one of (1) to (9), wherein, a forming material for the mask pattern includes metallic chromium.

(11) A fabrication method of a mask, comprising:
forming a transparent conductive layer on a first substrate;
forming a mask pattern on a second substrate, a forming material for the mask pattern including a non-transparent conductive material;
cell-assembling the first substrate and the second substrate, and forming a liquid crystal layer between the first substrate and the second substrate, the transparent conductive layer and the liquid crystal layer being located on a same side of the first substrate;
forming electrical connection between a voltage supply unit and the transparent conductive layer and electrical connection between the voltage supply unit and the mask pattern, the voltage supply unit being configured to provide preset voltage for the mask pattern and the transparent conductive layer, to generate an electric field for driving liquid crystal molecules in the liquid crystal layer to deflect.

(12) The method according to (11), wherein, after the forming a mask pattern on a second substrate, the method further comprises:
Forming a connection pattern on the second substrate, a forming material for the connection pattern including a transparent conductive material, and the connection pattern being configured to electrically connect the mask pattern portions separated from one another.

(13) A patterning method by using a mask, wherein, the mask is the mask according to any one of (1) to (10), the method comprising:
providing preset voltage for the mask pattern and the transparent conductive layer by the voltage supply unit, to generate an electric field therebetween, so as to drive liquid crystal molecules in the liquid crystal layer to deflect;
irradiating the first substrate, so that part of light passes through the first substrate, the transparent conductive layer, the liquid crystal layer and the second substrate sequentially, and exits from a region of the second substrate without the mask pattern thereon.

It should be noted that, in this specification, terms like "first" and "second" are only used to differentiate one entity or operation from another, but are not necessarily used to indicate any practical relationship or order between these entities or operations. Moreover, terms such as "include", "comprise" or any variation of the terms mean "including but not limited to". Therefore, a process, method, object, or device that includes a series of elements not only includes these elements, but also includes other elements that are not specified expressly, or may further include inherent elements of the process, method, object or device. In the case that there are no more limitations, in the context of a element that is defined by "includes a . . . ", the process, method, object or device that includes the element may include other identical elements.

Although the present disclosure is described in detail hereinbefore with general illustration and embodiments, based on the present disclosure, certain amendments or improvements can be made thereto, which is obvious for those skilled in the art. Therefore, the amendments or improvements made on the present disclosure without departing from the spirit of the present disclosure should be within the scope of the present disclosure.

The present application claims priority of Chinese Patent Application No. 201410589976.7 filed on Oct. 28, 2014, the disclosure of which is incorporated herein by reference in its entirety as part of the present application.

The invention claimed is:

1. A mask, comprising:
a first substrate and a second substrate disposed oppositely;
a liquid crystal layer located between the first substrate and the second substrate;
a transparent conductive layer formed on the first substrate, the transparent conductive layer and the liquid crystal layer being located on a same side of the first substrate; and
a mask pattern of a non-transparent conductive material formed on the second substrate,
wherein the mask pattern and the transparent conductive layer are configured to be capable of generating an electric field therebetween, so as to drive liquid crystal molecules in the liquid crystal layer to deflect.

2. The mask according to claim 1, wherein the mask pattern includes a first sub-mask pattern located in a first region and a second sub-mask pattern located in a second region different from the first region, the first sub-mask pattern including at least two first mask pattern portions separated at a first interval, the second sub-mask pattern including at least two second mask pattern portions separated at a second interval, and the first interval being smaller than the second interval.

3. The mask according to claim 2, wherein, all of the first mask pattern portions and all of the second mask pattern portions are electrically connected with one another.

4. The mask according to claim 3, wherein, the second substrate further includes a connection pattern made of a transparent conductive material formed thereon, and all of the first mask pattern portions and all of the second mask pattern portions are electrically connected with one another through the connection pattern.

5. The mask according to claim 3, wherein, the first mask pattern portion includes a strip electrode, the second mask pattern portion includes a strip electrode.

6. The mask according to claim 2, wherein, all of the first mask pattern portions are electrically connected with one another, all of the second mask pattern portions are electrically connected with one another, and any of the first mask pattern portions and any of the second mask pattern portions are electrically isolated.

7. The mask according to claim 2, wherein, the first mask pattern portion includes a strip electrode, the second mask pattern portion includes a strip electrode.

8. The mask according to claim 2, further comprising a voltage supply unit connected with the transparent conductive layer and the mask pattern, and configured to provide preset voltage for the mask pattern and the transparent conductive layer, to generate the electric field.

9. The mask according to claim 8, wherein, the second substrate further includes a connection pattern made of a transparent conductive material formed thereon, and all of the first mask pattern portions and all of the second mask pattern portions are electrically connected with one another through the connection pattern.

10. The mask according to claim 1, further comprising a voltage supply unit connected with the transparent conductive layer and the mask pattern, and configured to provide preset voltage for the mask pattern and the transparent conductive layer, to generate the electric field.

11. The mask according to claim 10, wherein, all of the first mask pattern portions and all of the second mask pattern portions are electrically connected with one another.

12. The mask according to claim 11, wherein, the second substrate further includes a connection pattern made of a transparent conductive material formed thereon, and all of the first mask pattern portions and all of the second mask pattern portions are electrically connected with one another through the connection pattern.

13. The mask according to claim 10, wherein, all of the first mask pattern portions are electrically connected with one another, all of the second mask pattern portions are electrically connected with one another, and any of the first mask pattern portions and any of the second mask pattern portions are electrically isolated.

14. The mask according to claim 10, wherein, the first mask pattern portion includes a strip electrode, the second mask pattern portion includes a strip electrode.

15. The mask according to claim 1, wherein, the mask pattern and the liquid crystal layer are located on two sides of the second substrate, respectively.

16. The mask according to claim 1, wherein, the liquid crystal molecules in the liquid crystal layer have preset pretilt angle.

17. The mask according to claim 1, wherein, a forming material for the mask pattern includes metallic chromium.

18. A patterning method by using a mask, wherein, the mask is the mask according to claim 1, the method comprising:
   providing preset voltage for the mask pattern and the transparent conductive layer by the voltage supply unit, to generate an electric field therebetween, so as to drive liquid crystal molecules in the liquid crystal layer to deflect;
   irradiating the first substrate, so that part of light passes through the first substrate, the transparent conductive layer, the liquid crystal layer and the second substrate sequentially, and exits from a region of the second substrate without the mask pattern thereon.

19. A fabrication method of a mask, comprising:
   forming a transparent conductive layer on a first substrate;
   forming a mask pattern on a second substrate, a forming material for the mask pattern including a non-transparent conductive material;
   cell-assembling the first substrate and the second substrate, and forming a liquid crystal layer between the first substrate and the second substrate, the transparent conductive layer and the liquid crystal layer being located on a sane side of the first substrate;
   forming electrical connection between a voltage supply unit and the transparent conductive layer and electrical connection between the voltage supply unit and the mask pattern, the voltage supply unit being configured to provide preset voltage for the mask pattern and the transparent conductive layer, to generate an electric field for driving liquid crystal molecules in the liquid crystal layer to deflect.

20. The method according to claim 19, wherein, after the forming a mask pattern on a second substrate, the method further comprises:
   forming a connection pattern on the second substrate, a forming material for the connection pattern including a transparent conductive material, and the connection pattern being configured to electrically connect the mask pattern portions separated from one another.

* * * * *